(12) United States Patent
Yamashita et al.

(10) Patent No.: US 10,720,523 B2
(45) Date of Patent: Jul. 21, 2020

(54) SEMICONDUCTOR DEVICE (71) Applicants: Kabushiki Kaisha Toshiba, Minato-ku, Tokyo (JP); Toshiba Electronic Devices & Storage Corporation, Minato-ku, Tokyo (JP)

(72) Inventors: Hiroaki Yamashita, Hakusan Ishikawa (JP); Syotaro Ono, Kanazawa Ishikawa (JP); Hisao Ichijo, Kanazawa Ishikawa (JP); Hideto Sugawara, Nonoichi Ishikawa (JP); Hiroshi Ohta, Kanazawa Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/241,057

(22) Filed: Jan. 7, 2019

(65) Prior Publication Data

US 2020/0058786 A1 Feb. 20, 2020

(30) Foreign Application Priority Data

Aug. 20, 2018 (JP) ................................ 2018-154251

(51) Int. Cl.
*H01L 29/78* (2006.01)
*H01L 29/66* (2006.01)
(Continued)

(52) U.S. Cl.
CPC ...... *H01L 29/7813* (2013.01); *H01L 29/0878* (2013.01); *H01L 29/1095* (2013.01); *H01L 29/66734* (2013.01)

(58) Field of Classification Search
CPC combination set(s) only.
See application file for complete search history.

(56) References Cited

U.S. PATENT DOCUMENTS

2003/0201456 A1 10/2003 Saitoh et al.
2003/0209741 A1 11/2003 Saitoh et al.
(Continued)

FOREIGN PATENT DOCUMENTS

JP 2004-006598 A 1/2004
JP 2005-285924 A 10/2005
(Continued)

*Primary Examiner* — Ratisha Mehta
(74) *Attorney, Agent, or Firm* — White & Case LLP (57) ABSTRACT

A semiconductor device includes a semiconductor body, first and second electrodes, and a control electrode. The semiconductor body includes first to fourth semiconductor layers. The first electrode is provided on a front surface of the semiconductor body. The second electrode is provided on a back surface of the semiconductor body. The control electrode is provided between the semiconductor body and the first electrode. The second semiconductor layer is positioned between a portion and other portion of the first semiconductor layer in a first direction directed along the front surface. The third semiconductor layer contacts the portion of first semiconductor layer and the second semiconductor layer. The third semiconductor layer includes a first end portion positioned in the portion of the first semiconductor layer and a second end portion positioned in the second semiconductor layer. The fourth semiconductor layer is selectively provided in the second end portion.

15 Claims, 8 Drawing Sheets

(51) Int. Cl.
*H01L 29/08* (2006.01)
*H01L 29/10* (2006.01)

(56) References Cited

U.S. PATENT DOCUMENTS

| | | |
|---|---|---|
| 2010/0102381 A1 | 4/2010 | Saito et al. |
| 2012/0007173 A1 | 1/2012 | Yamamoto et al. |
| 2018/0366574 A1* | 12/2018 | Ohse .................. H01L 29/0661 |

FOREIGN PATENT DOCUMENTS

| | | |
|---|---|---|
| JP | 2010-103337 A | 5/2010 |
| JP | 2011-003609 A | 1/2011 |
| JP | 2012-039082 A | 2/2012 |

* cited by examiner

000
SEMICONDUCTOR DEVICE

CROSS-REFERENCE TO RELATED APPLICATIONS

This application is based upon and claims the benefit of priority from Japanese Patent Application No. 2018-154251, filed on Aug. 20, 2018; the entire contents of which are incorporated herein by reference.

FIELD

Embodiments relate generally to a semiconductor device.

BACKGROUND

A high breakdown voltage semiconductor device for power control is required to have a low ON resistance and a high avalanche resistance. However, a trade-off relationship between the ON resistance and the avalanche resistance is obstacle to reduce the ON resistance and enlarge the avalanche resistance.

BRIEF DESCRIPTION OF THE DRAWINGS

FIGS. 3A to 4B are schematic cross sectional views showing manufacturing processes of the semiconductor device according to the first embodiment;

DETAILED DESCRIPTION

According to one embodiment, a semiconductor device includes a semiconductor body, a first electrode, a second electrode and a control electrode. The semiconductor body includes a first semiconductor layer of a first conductivity type and a second semiconductor layer of a second conductivity type. The first electrode is provided on a front surface of the semiconductor body. The second electrode is provided on a back surface of the semiconductor body. The control electrode is provided between the semiconductor body and the first electrode. The control electrode faces the front surface of the semiconductor body via a first insulating film. The control electrode is electrically insulated from the first electrode by a second insulating film. The second semiconductor layer is positioned between a portion of the first semiconductor layer and other portion of the first semiconductor layer in a first direction directed along the front surface of the semiconductor body. The semiconductor body further includes a third semiconductor layer of the second conductivity type and a fourth semiconductor layer of the first conductivity type. The third semiconductor layer contacts the first semiconductor layer and the second semiconductor layer. The fourth semiconductor layer is selectively provided in the third semiconductor layer. The front surface of the semiconductor body includes a surface of the third semiconductor layer and a surface of the fourth semiconductor layer. The third semiconductor layer includes a first end portion and a second end portion, the first end portion being positioned in the portion of the first semiconductor layer, the second end portion being positioned in the second semiconductor layer. The fourth semiconductor layer is provided in the second end portion of the third semiconductor layer. The first electrode is electrically connected to the third semiconductor layer and the fourth semiconductor layer. The control electrode faces a portion of the second semiconductor layer, a portion of the third semiconductor layer and the other portion of the first semiconductor layer, the portion of the second semiconductor layer and the portion of the third semiconductor layer being positioned between the fourth semiconductor layer and the other part of the first semiconductor layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1:
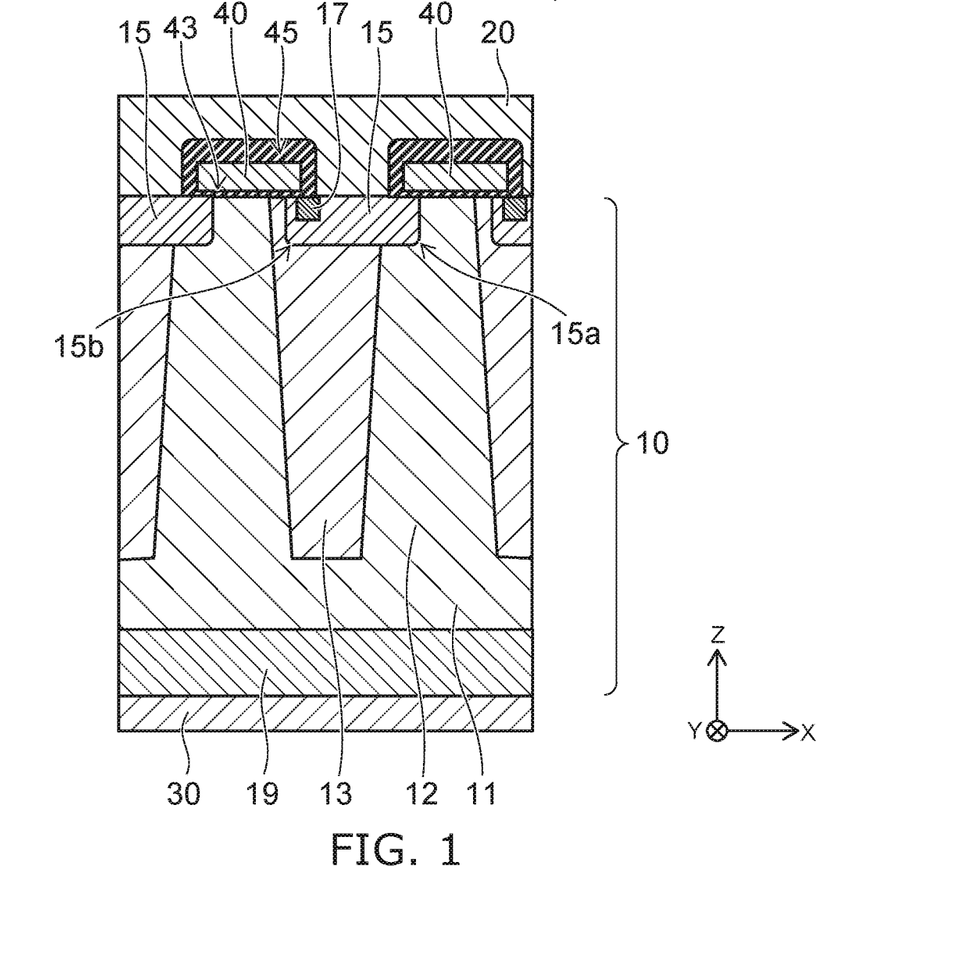
FIG. 1 is a schematic cross sectional view showing a semiconductor device according to a first embodiment.

FIG. 1 is a schematic cross sectional view showing a semiconductor device 1 according to the first embodiment. The semiconductor device 1 is, for example, a power MOS transistor having a super-junction structure.

As shown in FIG. 1, the semiconductor device 1 includes a semiconductor body 10, a source electrode 20, a drain electrode 30, and a gate electrode 40. The semiconductor device 1 has a vertical structure in which the semiconductor body 10 is disposed between the source electrode 20 and the drain electrode 30. The source electrode 20 is provided on a front surface of the semiconductor body 10. The drain electrode 30 is provided on a back surface of the semiconductor body 10.

The semiconductor body 10 includes an n-type pillar layer 12, a p-type pillar layer 13, a p-type diffusion layer 15, and an n-type source layer 17.

The n-type pillar layer 12 and the p-type pillar layer 13 are, for example, arranged alternately in the X-direction along the back surface of the semiconductor body 10. The n-type pillar layer 12 and the p-type pillar layer 13 extend, for example, in the Z-direction crossing the front surface of the semiconductor body 10.

The p-type diffusion layer 15 is selectively provided on the front surface side of the semiconductor body 10. The p-type diffusion layer 15 is provided on the n-type pillar layer 12 and the p-type pillar layer 13 that are adjacent in the X-direction. The p-type diffusion layer 15 is provided so as to be exposed to the front surface of the semiconductor body 10. In other words, the front surface of the semiconductor body 10 includes a surface of the p-type diffusion layer. Moreover, the p-type diffusion layer 15 includes a first end portion 15a positioned in the n-type pillar layer 12, and a second end portion 15b positioned in the p-type pillar layer 13. The p-type diffusion layer 15 contains a p-type impurity having a concentration higher than a concentration of a p-type impurity in the p-type pillar layer 13.

For example, the amount of the p-type impurity contained in the p-type pillar layer 13 at a portion of the p-type pillar layer 13 positioned between a level of a lower end of the p-type pillar layer 13 on the drain electrode 30 side and a level of the boundary of the p-type pillar layer 13 and the p-type diffusion layer 15 balances an amount of an n-type impurity contained in the n-type pillar layer 12 at a portion of the n-type pillar layer 12 positioned between the level of the lower end of the p-type pillar layer 13 and the level of the boundary of the p-type pillar layer 13 and the p-type diffusion layer 15.

The n-type source layer 17 is selectively provided in the p-type diffusion layer 15. The source layer 17 is provided at the second end portion 15b of the p-type diffusion layer 15 so as to be exposed in the front surface of the semiconductor body 10. In other words, the front surface of the semiconductor body 10 includes a surface of the n-type source layer 17. The n-type source layer 17 contains an n-type impurity having a concentration higher than a concentration of an n-type impurity in the n-type pillar layer 12.

The semiconductor body 10 further includes an n-type semiconductor layer 11 and an n-type drain layer 19. The n-type semiconductor layer 11 is positioned between the p-type pillar layer 13 and the drain electrode 30, and is provided so connected to the n-type pillar layer 12. The n-type drain layer 19 is positioned between the n-type semiconductor layer 11 and the drain electrode 30. The n-type drain layer 19 contains an n-type impurity having a concentration higher than a concentration of an n-type impurity in the n-type semiconductor layer 11, and contacts the drain electrode 30. The drain electrode 30 is electrically connected to the n-type drain layer 19.

The gate electrode 40 is disposed between the semiconductor body 10 and the source electrode 20, and is provided to face the front surface of the semiconductor body 10 via a gate insulating film 43. The gate electrode 40 is disposed to face the exposed surfaces of a portion of the p-type pillar layer 13 and a portion of the p-type diffusion layer 15 between the n-type source layer 17 and the n-type pillar layer 12 close to the second end portion 15b of the p-type diffusion layer 15. Also, the gate electrode 40 is disposed to face the exposed surface of the n-type pillar layer 12 via the gate insulating film 43.

The source electrode 20 is provided to cover the front surface of the semiconductor body 10 and the gate electrode 40. The source electrode 20 contacts the exposed surfaces of the p-type diffusion layer 15 and the n-type source layer 17. The source electrode 20 is electrically connected to the p-type diffusion layer 15 and the n-type source layer 17. The source electrode 20 is electrically insulated from the gate electrode 40 by the insulating film 45.

Figure 2:
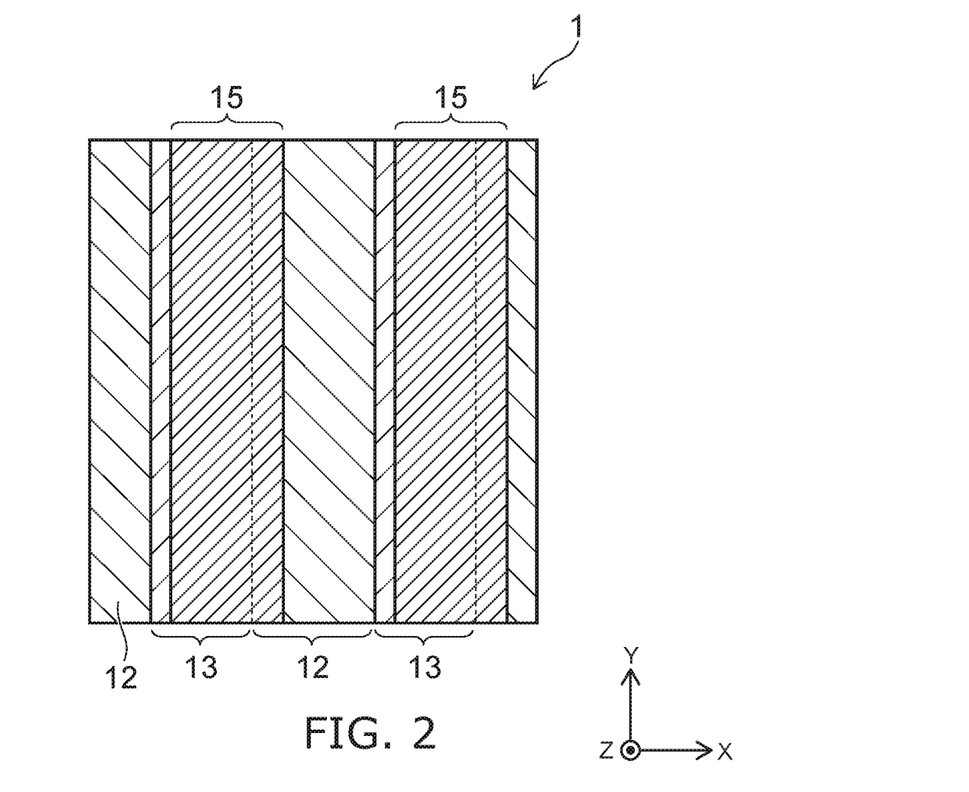
FIG. 2 is schematic plan view showing the semiconductor device according to the first embodiment.

FIG. 2 is a schematic plan view showing the semiconductor device 1 according to the first embodiment. FIG. 2 is a schematic view showing the arrangement of the n-type pillar layer 12, the p-type pillar layer 13 and the p-type diffusion layer 15.

As shown in FIG. 2, the n-type pillar layer 12 and the p-type pillar layer 13 are provided to extend in the Y-direction. The n-type pillar layer 12 and the p-type pillar layer 13 are alternately arranged in the X-direction. The n-type source layer 17, the gate electrode 40 (not shown) and the p-type diffusion layer 15 also extend, for example, in the Y-direction along the front surface of the semiconductor body 10.

FIG. 3A to FIG. 4B are schematic cross sectional views sequentially showing manufacturing processes of the semiconductor device 1 according to the first embodiment. The semiconductor device 1 is manufactured using a wafer including an n-type semiconductor substrate SS and the n-type semiconductor layer 11 formed thereon. The n-type semiconductor substrate SS is, for example, a silicon substrate, and the n-type semiconductor layer 11 is, for example, an n-type silicon layer.

Figure 3A:
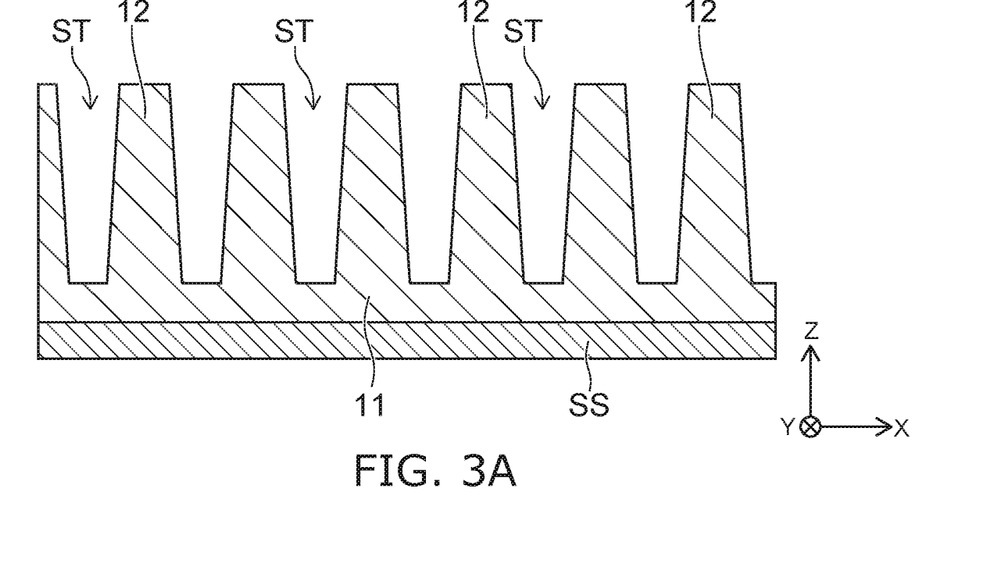

As shown in FIG. 3A, multiple trenches ST are formed in the n-type semiconductor layer 11. The trenches ST extend, for example, in the Y-direction. Portions divided by the trenches ST in the n-type semiconductor layer 11 are the n-type pillar layers 12.

Figure 3B:
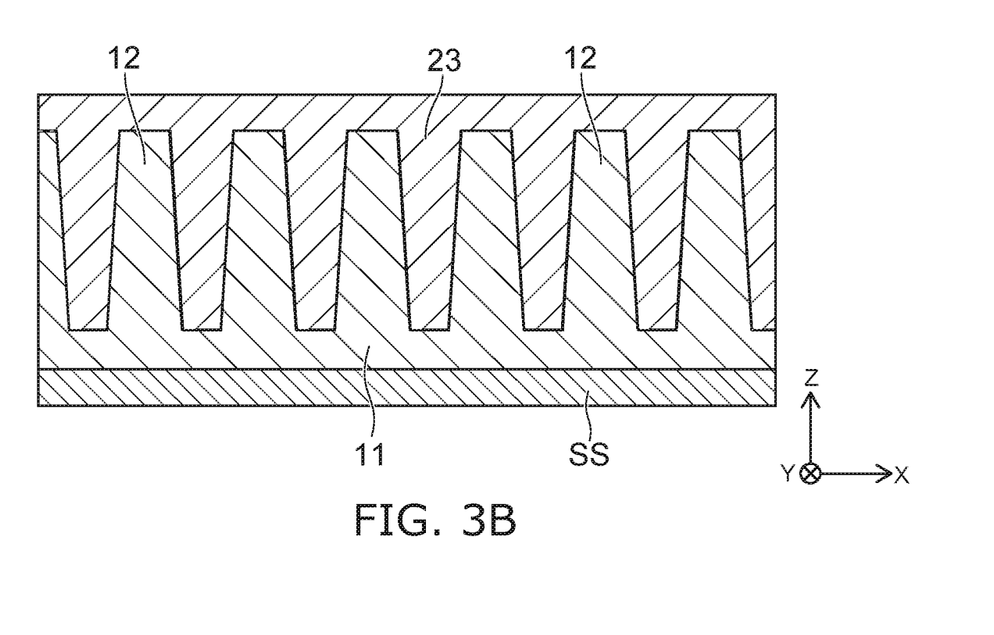

As shown in FIG. 3B, a p-type semiconductor layer 23 is formed in the trenches ST so as to fill inside thereof. The p-type semiconductor layer 23 is, for example, a p-type silicon layer. The p-type semiconductor layer 23 is formed such that the amount of p-type impurities in a portion filling a trench ST balances the amount of n-type impurities in an n-type pillar layer 12.

Figure 4A:
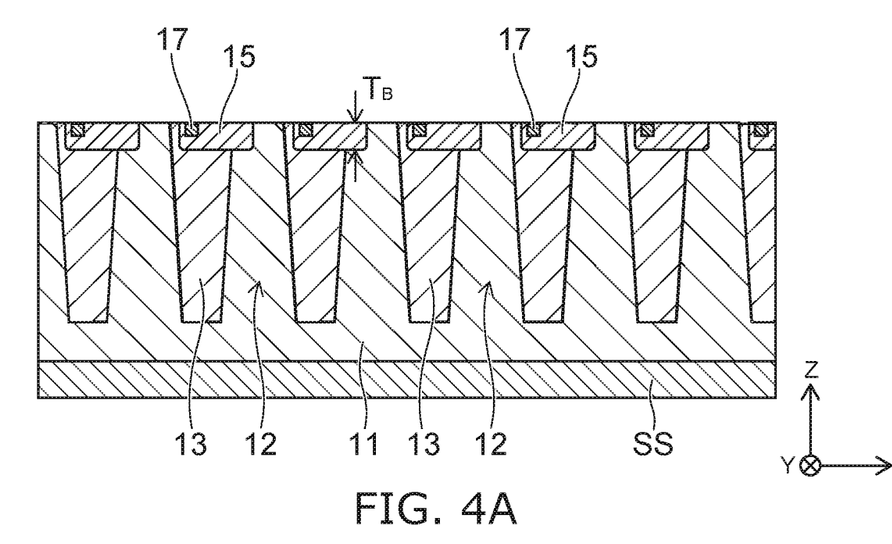

As shown in FIG. 4A, the p-type semiconductor layer 23 is etched back, leaving the p-type pillar layers 13 in the trenches ST. Thereby, the super-junction structure is formed in which the n-type pillar layer 12 and the p-type pillar layer 13 are alternately arranged. Subsequently, the p-type diffusion layer 15 and the n-type source layer 17 are selectively formed.

The p-type diffusion layer 15 is, for example, formed by a heat treatment of the wafer for diffusing p-type impurities after the p-type impurities are introduced into the upper ends of the n-type pillar layer 12 and the p-type pillar layer 13 using an ion implantation method.

The n-type source layer 17 is formed, for example, by introducing n-type impurities into the p-type diffusion layer 15 using the ion implantation method. The n-type source layer 17 is formed in a portion of the p-type diffusion layer 15 positioned above the pillar payer 13.

Figure 4B:
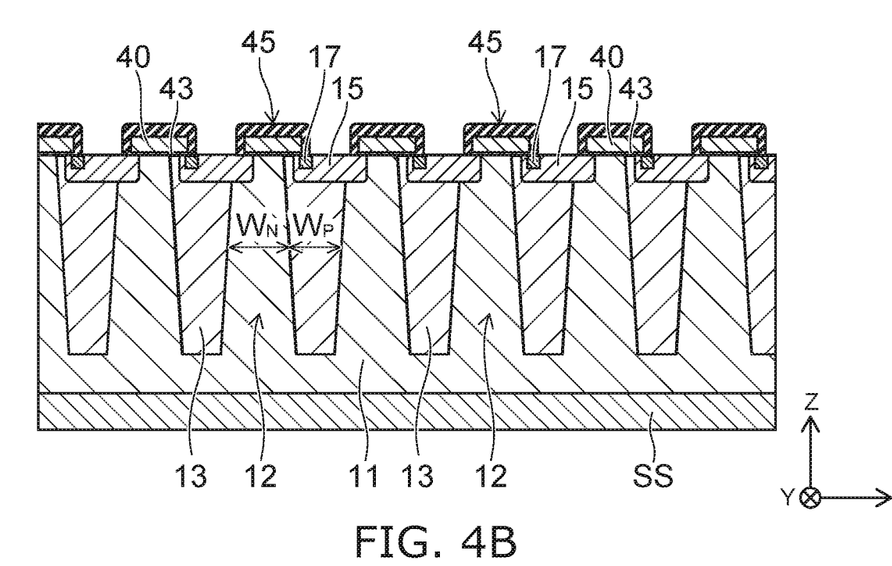

As shown in FIG. 4B, the gate electrode 40 is formed on the n-type pillar layer 12 and the p-type pillar layer 13 via the gate insulating film 43. Further, the source electrode 20 is formed (see FIG. 1) after an insulating film 45 is formed to cover the gate electrode 40. Subsequently, the n-type drain layer 19 (see FIG. 1) is formed by grinding or polishing the n-type semiconductor substrate SS on the back surface side. Moreover, the semiconductor device 1 is completed by forming the drain electrode 30 contacting the n-type drain layer 19.

In the super-junction structure described above, for example, it is possible to reduce the ON resistance per unit area by narrowing a width $W_N$ in the X-direction of the n-type pillar layer 12 and a width $W_P$ in the X-direction of the p-type pillar layer 13, and by making the impurity concentrations higher in the n-type pillar layer 12 and the p-type pillar layer 13, while maintaining the breakdown voltage.

On the other hand, in the heat treatment process for forming the p-type diffusion layer 15, diffusions of the n-type impurities and the p-type impurities also occur in the n-type pillar layer 12 and in the p-type pillar layer 13. Thereby, the compensation effects of the p-type carriers and the n-type carriers take place in the n-type pillar layer 12 and the p-type pillar layer 13 due to mutual diffusion of the n-type impurities and the p-type impurities between the n-type pillar layer 12 and the p-type pillar layer 13. As a result, there may be a case where the carrier concentrations decrease in the super-junction structure, and the ON resistance may not be sufficiently reduced in the semiconductor device 1.

For example, there is a method for reducing the ON resistance by increasing the impurity concentrations under taking into account the carrier compensations by heat treatment. In such a case, however, it may be difficult to achieve the stable ON resistance and high breakdown voltage due to variation in the manufacturing processes. Therefore, it is preferable to suppress the diffusions of the n-type impurities and the p-type impurities by lowering the temperature of heat treatment or making the heat treatment time shorter when forming the p-type diffusion layer 15.

However, suppressing the diffusion of the p-type impurities by the heat treatment under the lowered temperature or the shortened time makes the depth $T_B$ of the p-type impurity layer 15 shallower (see FIG. 4A). Thereby, the electric field concentration may easily occur at the first end portion 15a and the second end portion 15b of the p-type diffusion layer 15. In the semiconductor device 1 according to the embodiment, it is possible to avoid the lowering of avalanche resistance and to reduce the ON-resistance by disposing the first end portion 15a without the n-type source layer 17 in the n-type pillar layer 12 and the second end portion 15b with the n-type source layer 17 in the p-type pillar layer 13.

Figure 5A:
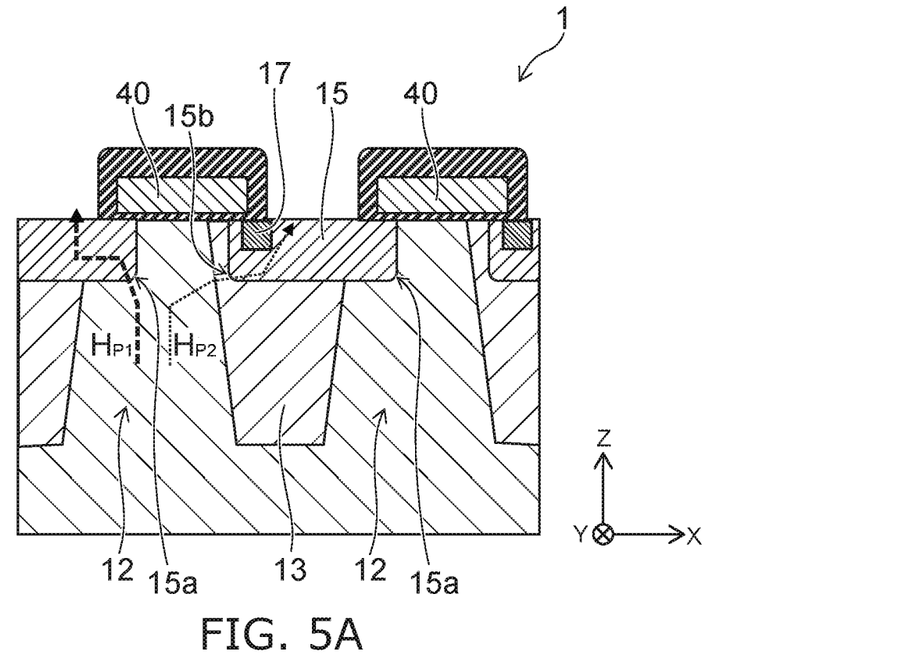
FIGS. 5A and 5B are schematic cross sectional views showing the operation of the semiconductor device according to the first embodiment.
Figure 5B:
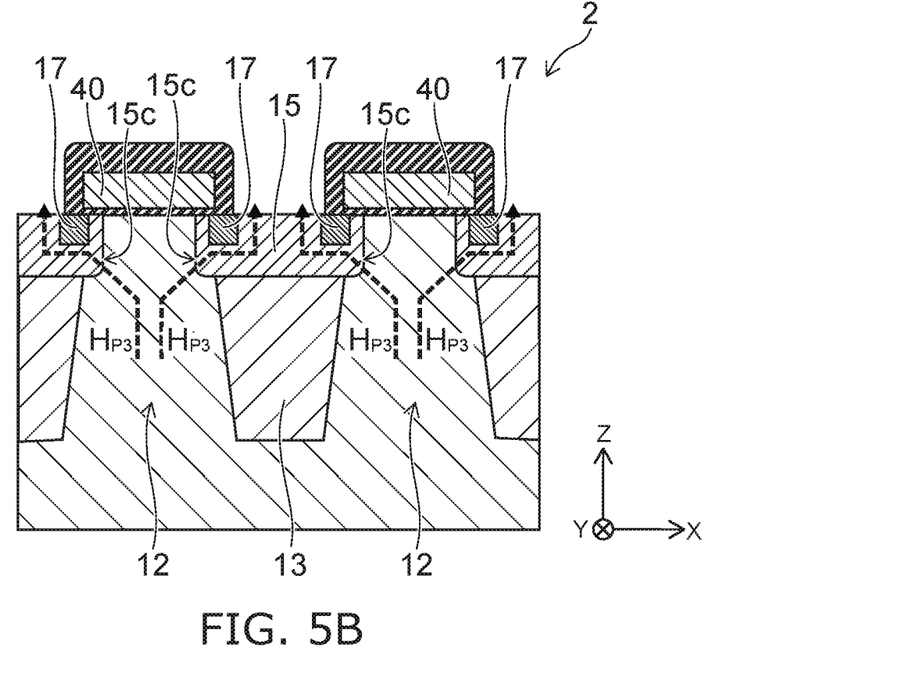

FIG. 5A is a schematic cross sectional view showing the operation of the semiconductor device 1 according to the first embodiment. FIG. 5B is a schematic cross sectional view showing the operation of a semiconductor device 2 according to a comparative example. FIG. 5A and FIG. 5B show a hole current path in the case of the semiconductor devices 1 and 2 being in the avalanche state.

As shown in FIG. 5A, the semiconductor device 1 has a current path $H_{P1}$ and a current path $H_{P2}$. In the current path $H_{P1}$, the hole current flows to the source electrode 20 through the first end portion 15a of the p-type diffusion layer 15 positioned in the n-type pillar layer 12 (see FIG. 1). In the current path $H_{P2}$, the hole current flows to the source electrode 20 through the second end portion 15b positioned in the p-type pillar layer 13.

In the semiconductor device 1, the electric field at the second end portion 15b positioned in the p-type pillar layer 12 is suppressed to be lower than the electric field at the first end portion 15a positioned in the n-type pillar layer 12. Thus, the hole current flowing through the current path $H_{P2}$ is smaller than the hole current flowing through the current path $H_{P1}$. Thereby, it is possible in the path $H_{P2}$, for example, to avoid the turn-on of a parasitic bipolar transistor configured by the n-type pillar layer 12, the p-type diffusion layer 15 and the n-type source layer 17.

In contrast, the parasitic bipolar transistor does not exist in the current path $H_{P1}$, because the n-type source layer 17 is not provided at the first end portion 15a. Moreover, the punch through phenomena due to depletion of the p-type diffusion layer 15 also does not take place at the first end portion 15a. Thus, it is possible in the semiconductor device 1 to enlarge the avalanche resistance by suppressing the turn-on of the parasitic bipolar transistor and the punch through in the p-type diffusion layer 15.

In the semiconductor device 2 shown in FIG. 5B, end portions 15c on both sides of the p-type diffusion layer 15 are positioned in the n-type pillar layers 12, respectively. The n-type source layer 17 is provided on both end portions 15c of the p-type diffusion layer 15. Thus, a current path $H_{P3}$ for the hole current is formed on both sides of the p-type diffusion layer 15.

In the semiconductor device 2, the electric field concentrates on both end portions 15c of the p-type diffusion layer 15, and the hole current flows at the same level through both current paths $H_{P3}$. Thus, it is difficult in the semiconductor device 2 to avoid the turn-on of the parasitic bipolar transistor, and the avalanche resistance is small.

Moreover, the hole current does not always flow evenly through both end portions 15c of the p-type diffusion layer 15, and may flow through one of the end portions 15c. In such a case, the current path $H_{P3}$ is not always fixed such that the hole current flows through one of the two end portions 15c of the p-type diffusion layer 15. The hole current may change the flowing route from one current path $H_{P3}$ through one of the two end portions 15c to the other current path $H_{P3}$ through the other of the two end portions 15c, depending on the electrical resistance change, for example, caused by temperature raise. That is, the avalanche point moves in the semiconductor device 2. In contrast, the oscillation phenomena induced by the movement of the avalanche point is suppressed in the semiconductor device 1, since the hole current mainly flows through the fixed current path $H_{P1}$.

Figure 6A:
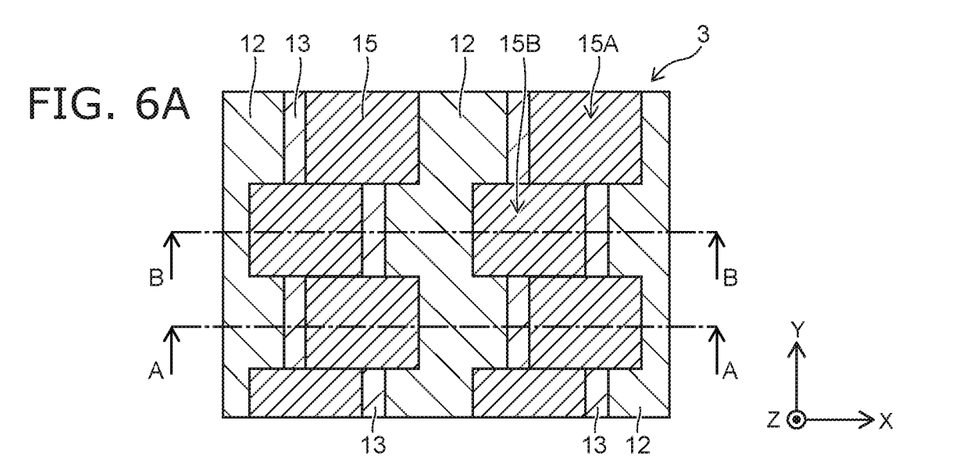
FIGS. 6A to 6C are schematic cross sectional views showing a semiconductor device according to a variation of the first embodiment.
Figure 6B:
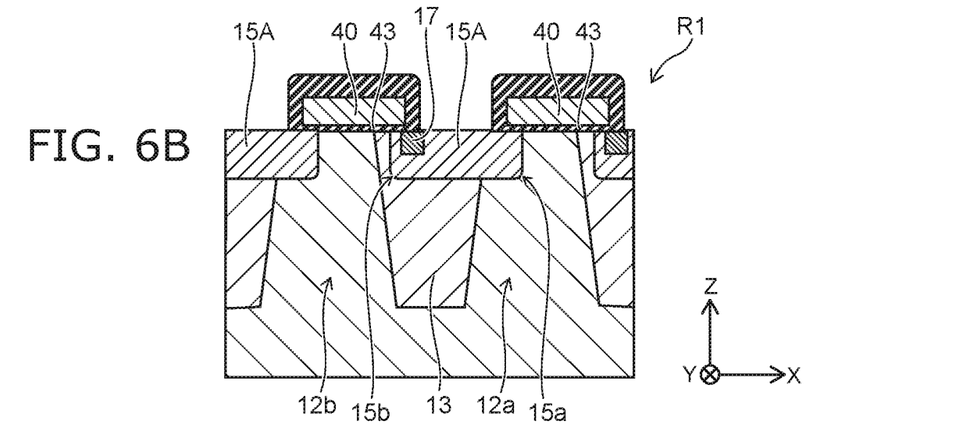
Figure 6C:
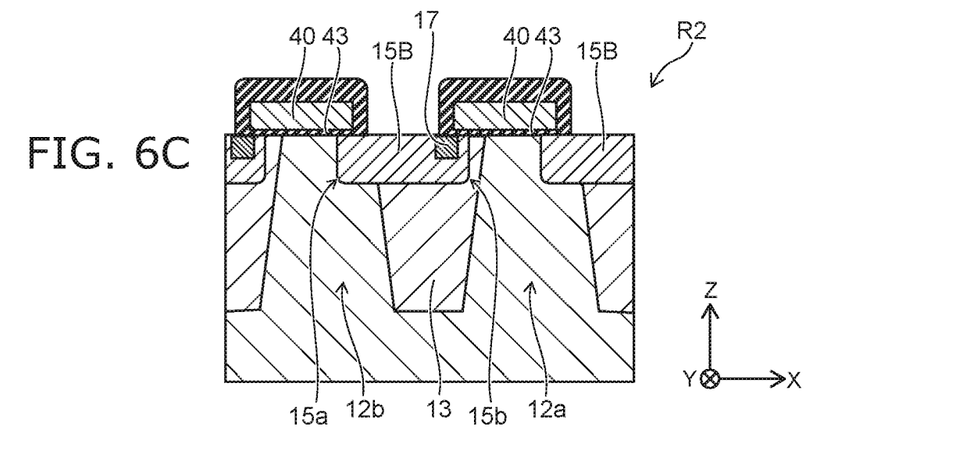

FIGS. 6A to 6C are schematic cross sectional views showing a semiconductor device 3 according to a variation of the first embodiment. FIG. 6A is a schematic view showing arrangement of n-type pillar layers 12, p-type pillar layers 13 and p-type diffusion layers 15. FIG. 6B is a schematic view showing a cross section along A-A line shown in FIG. 6A. FIG. 6C is a schematic view showing a cross section along B-B line shown in FIG. 6A.

As shown in FIG. 6A, also in this example, the n-type pillar layers 12 and the p-type pillar layers 13 extend in the Y-direction. The p-type diffusion layers 15 include a p-type diffusion layer 15A and a p-type diffusion layer 15B arranged alternately in the Y-direction.

As shown in FIG. 6B, the p-type diffusion layer 15A is provided on an n-type pillar layer 12a and a p-type pillar layer 13. The p-type diffusion layer 15A includes the first end portion 15a positioned in the n-type pillar layer 12a and the second end portion 15b positioned in the p-type pillar layer 13. The n-type source layer 17 is provided in the second end portion 15b.

As shown in FIG. 6C, the p-type diffusion layer 15B is provided on an n-type pillar layer 12b and the p-type pillar layer 13. The p-type pillar layer 13 is positioned between the n-type pillar layer 12a and the n-type pillar layer 12b. The n-type pillar layer 12b is adjacent to the n-type pillar layer 12a in the X-direction with the p-type pillar layer 13 interposed. That is, the n-type pillar layer 12b is opposed to the n-type pillar layer 12a in the X-direction via the p-type pillar layer 13.

The p-type diffusion layer 15B includes the first end portion 15a positioned in the n-type pillar layer 12b and the second end portion 15b positioned in the p-type pillar layer 13. The n-type source layer 17 is provided in the second end portion 15b.

The semiconductor device 3 is configured such that a drain current flows on both sides of the p-type pillar layer 13. When the semiconductor device 3 is turned on, the drain current flows from the n-type pillar layer 12 to the n-type source layer 17 through an inversion layer formed at an interface between the insulating film 43 and the p-type region positioned below the gate electrode 40.

In the semiconductor device 3, the drain current flows evenly in the n-type pillar layer 12 positioned on both sides of the p-type pillar layer 13. Thereby, it is possible to suppress the increase of the ON resistance comparing with the case where the n-type source layer 17 is formed only at one end portion of the p-type diffusion layer 15.

Second Embodiment

Figure 7A:
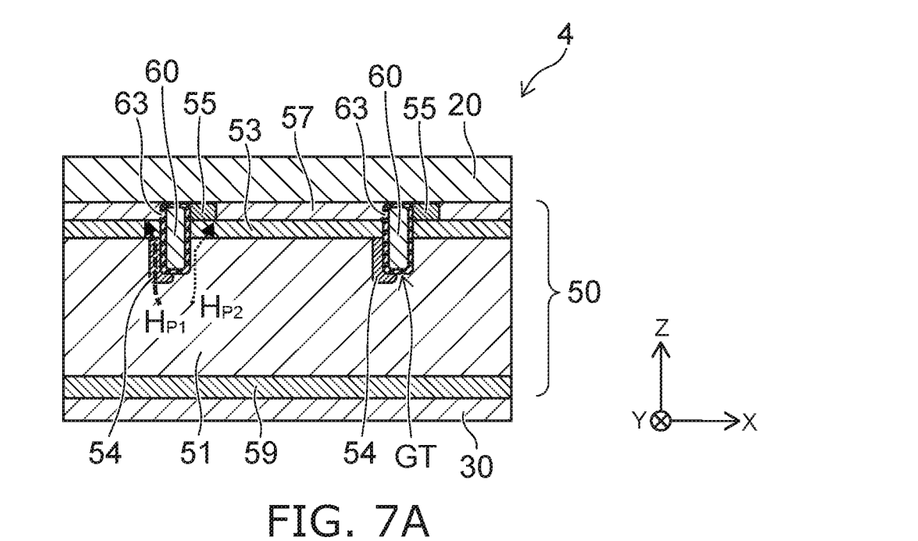
FIGS. 7A and 7B are schematic cross sectional views showing a semiconductor device according to a second embodiment.
Figure 7B:
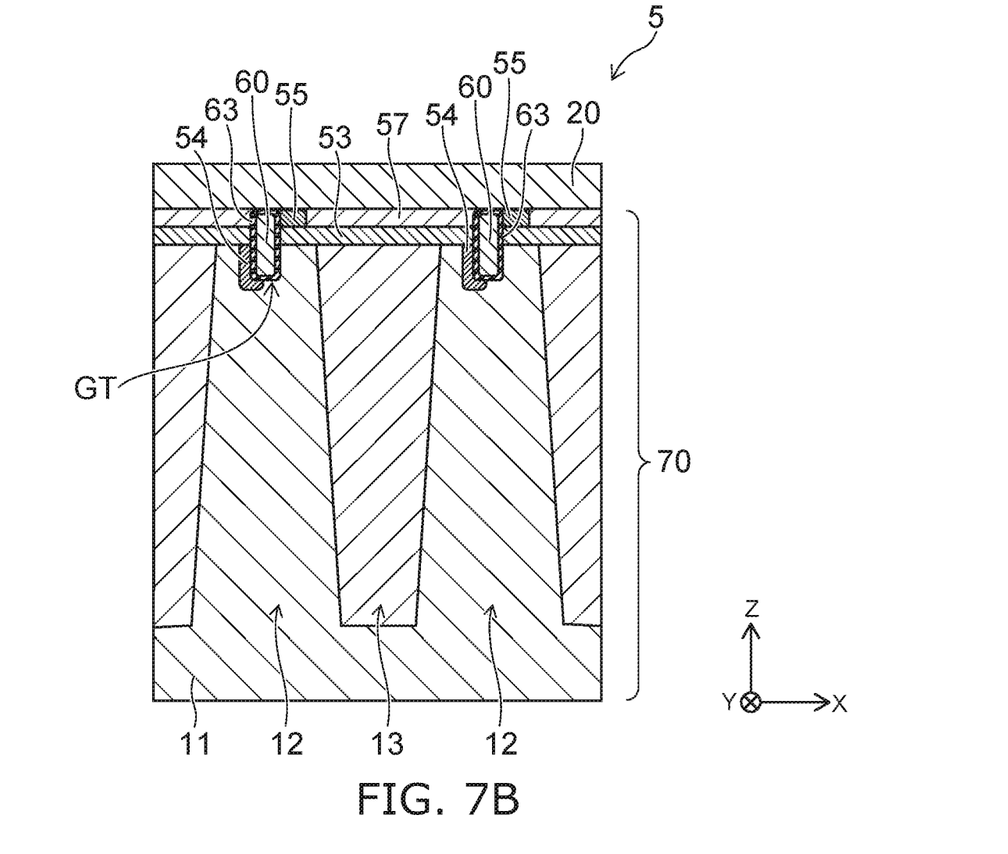

FIGS. 7A and 7B are schematic cross sectional views showing semiconductor devices 4 and 5 according to a second embodiment. FIG. 7A is a schematic view showing a trench gate type MOS transistor. FIG. 7B is a schematic view showing a trench gate type MOS transistor having a super junction structure.

As shown in FIG. 7A, the semiconductor device 4 includes a source electrode 20, a drain electrode 30, a gate electrode 60, and a semiconductor body 50. The source electrode 20 is provided on a front surface of the semiconductor body 50, and the drain electrode 30 is provided on a back surface of the semiconductor body 50. The gate electrode 60 is positioned between the source electrode 20 and the semiconductor body 50. The gate electrode 60 is disposed via a gate insulating film 63 inside a trench gate GT provided in the semiconductor body 50.

The semiconductor body 50 includes an n-type drift layer 51, a p-type diffusion layer 53, an n-type source layer 55, a p-type contact layer 57, and an n-type drain layer 59. The p-type diffusion layer 53 is positioned between the source electrode 20 and the n-type drift layer 51 and, for example, contacts the n-type drift layer 51. The n-type source layer 55 is positioned between the source electrode 20 and the p-type diffusion layer 53, and is provided so as to contact the source electrode 20 and the p-type diffusion layer 53. The n-type source layer 55 is selectively provided between the source electrode 20 and the p-type diffusion layer 53, and is disposed at a position capable of contacting the gate insulating film 63.

The p-type contact layer 57 is selectively provided between the source electrode 20 and the p-type diffusion layer 53, and contacts the source electrode 20a and the p-type diffusion layer 53. The p-type contact layer 57 contains a p-type impurity having a concentration higher than a concentration of a p-type impurity in the p-type diffusion layer 53. The n-type drain layer 59 is positioned between the drain electrode 30 and the n-type drift layer 51, and contacts the drain electrode 30 and the n-type drift layer 51. The n-type drain layer 59 contains an n-type impurity having a concentration higher than a concentration of an n-type impurity in the n-type drift layer 51.

The gate trench GT has a depth capable of reaching the inside of the n-type drift layer 51 from the surface of the semiconductor body 50 and, for example, extends in the Y-direction. The gate electrode 60 extends in the Y-direction inside the gate trench GT. The gate electrode 60 is provided via the gate insulating film 63 so as to face the n-type drift layer 51, the p-type diffusion layer 53 and the n-type source layer 55, which are exposed inside the gate trench GT.

The semiconductor body 50 further includes a p-type diffusion layer 54. The p-type diffusion layer 54 is provided between the n-type drift layer 51 and the gate electrode 60 and contacts the gate insulating film 63. The p-type diffusion layer 54 extends, for example, along one side surface of the gate electrode 60 in the X-direction. The p-type diffusion layer 54 is provided so as to be linked to the p-type diffusion layer 53.

The p-type diffusion layer 54 is not provided, for example, on a side where the other side surface among both side surfaces of the gate electrode 60 faces the n-type source layer 55 in the X-direction. The n-type source layer 55 is not provided, for example, on a side where the one side surface among the both side surfaces of the gate electrode 60 faces the p-type diffusion layer 54 in the X-direction.

The p-type diffusion layer 54 extends to a lower end of the gate electrode 60 in the n-type drift layer 51. Thereby, when the semiconductor device 4 is in the avalanche state, for example, holes are generated in a high electric field region near the lower end of the gate electrode 60, and the holes can move to the source electrode 20 via the discharge path $H_{P1}$ through the p-type diffusion layer 54. In contrast, on the opposite side of the gate electrode 60, the p-type diffusion layer 54 is not provided in a region along the other side surface. Accordingly, holes are reduced, which are discharged to the source electrode 20 via the discharge path $H_{P2}$ through this region.

Thereby, it is possible in the semiconductor device 4 to improve the avalanche resistance by suppressing the turn-on of the parasitic bipolar transistor that is configured by the n-type drift layer 51, the p-type diffusion layer 53 and the n-type source layer 55. Moreover, since the discharge path of holes is fixed to the discharge path HP1, it is also possible to suppress the oscillation phenomena induced by the movement of the avalanche point.

As shown in FIG. 7B, the semiconductor device 5 includes a source electrode 20, a gate electrode 60 and a semiconductor body 70. The source electrode 20 is provided on a front surface of the semiconductor body 70, and the gate electrode 60 is disposed via a gate insulating film 63 inside a gate trench GT that is provided in the semiconductor body 70. Note that the drain electrode 30 and the n-type drain layer 19 (see FIG. 1) are omitted in FIG. 7B.

The semiconductor body 70 includes an n-type semiconductor layer 11, a p-type pillar layer 12, a p-type pillar layer 13, a p-type diffusion layer 53, an n-type source layer 55 and a p-type contact layer 57. The n-type pillar layer 12 and the p-type pillar layer 13 are alternately arranged, for example, in the X-direction. The n-type semiconductor layer 11 is positioned below the p-type pillar layer 13, and is disposed so as to be linked to the n-type pillar layer 12.

The p-type diffusion layer 53 is positioned between the source electrode 20 and the n-type pillar layer 12 and between the source electrode 20 and the p-type pillar layer 13. The n-type source layer 55 is selectively provided between the source electrode 20 and the p-type diffusion layer 53, and is disposed at a position capable of contacting the gate insulating film 63. The p-type contact layer 57 is selectively provided between the source electrode 20 and the p-type diffusion layer 53, and contacts the source electrode 20 and the p-type diffusion layer 53.

The gate trench GT is provided in the n-type pillar layer 12, and has a depth capable of reaching the n-type pillar layer 12 from the front surface of the semiconductor body 70. The gate electrode 60 is disposed inside the gate trench GT, and the lower end of the gate electrode 60 is positioned at a level inside the n-type pillar layer 12.

The semiconductor body 50 further includes a p-type diffusion layer 54. The p-type diffusion layer 54 is provided in the n-type pillar layer 12, and extends along, for example, one side surface of the gate electrode 60 in the X-direction. The p-type diffusion layer 54 is provided so as to be linked to the p-type diffusion layer 53. The p-type diffusion layer 54 is not provided, for example, on a side where the other side surface of both side surfaces of the gate electrode 60 faces the n-type source layer 55 in the X-direction. The n-type source layer 55 is not provided, for example, on a side where the one side surface of both side surfaces of the gate electrode 60 faces the p-type diffusion layer 54 in the X-direction.

It is possible in the semiconductor device 5 to suppress the turn-on of the parasitic bipolar transistor configured by the n-type pillar layer 12, the p-type diffusion layer 53 and the n-type source layer 55, and to improve the avalanche resistance. It is also possible to suppress the oscillation phenomena induced by the movement of the avalanche point.

Figure 8A:
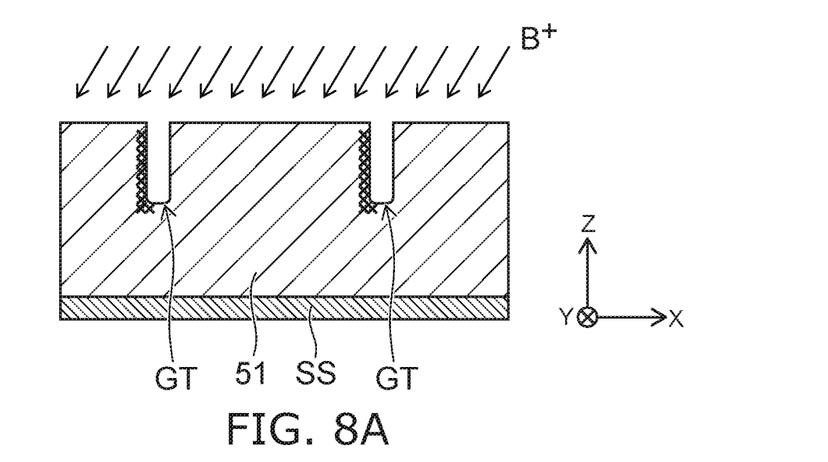
FIGS. 8A to 8C are schematic cross sectional views showing manufacturing processes of the semiconductor device according to the second embodiment.
Figure 8B:
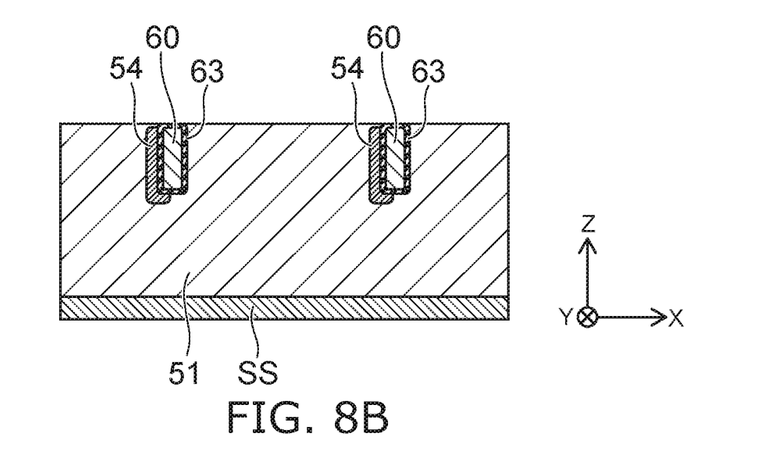
Figure 8C:
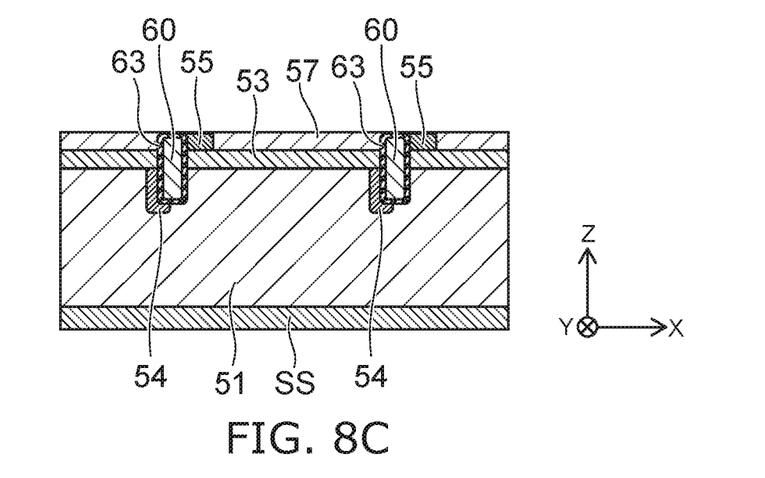

Then, a manufacturing method of the semiconductor device 4 will be described with reference to FIGS. 8A to 8C. FIGS. 8A to 8C are schematic cross sectional views sequentially showing the manufacturing processes of the semiconductor device 4.

As shown in FIG. 8A, p-type impurities such as boron (B) are ion-implanted after the trench gate GT is formed in the n-type drift layer 51. The p-type impurities are introduced into the n-type drift layer 51 by the oblique ion-implantation in which the injection angle is set to be larger. Thereby, the p-type impurities are introduced on one side of the inner wall in the gate trench GT.

As shown in FIG. 8B, after the p-type diffusion layer 54 is formed by activating the ion-implanted p-type impurities, the gate insulating film 63 and the gate electrode 60 are formed in the gate trench GT. The gate insulating film 63 is, for example, a silicon oxide film, and is formed by thermally oxidizing at the inner surface of the gate trench GT.

As shown in FIG. 8C, the p-type diffusion layer 53, the n-type source layer 55 and the p-type contact layer 57 are formed on the front surface side of the n-type drift layer 51. The p-type diffusion layer 53, the n-type source layer 55 and the p-type contact layer 57 are formed, for example, by using an ion-implantation method.

Subsequently, an n-type drain layer is formed by thinning the n-type semiconductor substrate SS after the source electrode 20 is formed. Further, the drain electrode 30 is formed to complete the semiconductor device 4.

The semiconductor device 5 may also be manufactured by using the similar method. For example, after the n-type pillar layer 12 and the p-type pillar layer 13 are formed (see FIG. 3B and FIG. 4A), the gate trench GT is formed in the n-type pillar layer 12. Subsequently, the semiconductor device 5 is completed through the manufacturing processes shown in FIGS. 8A to 8C.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a semiconductor body including a first semiconductor layer of a first conductivity type and a second semiconductor layer of a second conductivity type;
a first electrode provided on a front surface of the semiconductor body;
a second electrode provided on a back surface of the semiconductor body; and
a control electrode provided between the semiconductor body and the first electrode, the control electrode facing the front surface of the semiconductor body via a first insulating film, the control electrode being electrically insulated from the first electrode by a second insulating film,
the second semiconductor layer being positioned between a portion of the first semiconductor layer and other portion of the first semiconductor layer in a first direction directed along the front surface of the semiconductor body,
the semiconductor body further including a third semiconductor layer of the second conductivity type and a fourth semiconductor layer of the first conductivity type, the third semiconductor layer contacting the portion of first semiconductor layer and the second semiconductor layer, the fourth semiconductor layer being selectively provided in the third semiconductor layer, the front surface of the semiconductor body including a surface of the third semiconductor layer and a surface of the fourth semiconductor layer,
the third semiconductor layer including a first end portion and a second end portion, the first end portion being positioned in the portion of the first semiconductor layer, the second end portion being positioned in the second semiconductor layer,
the fourth semiconductor layer being provided in the second end portion of the third semiconductor layer,
the first electrode being electrically connected to the third semiconductor layer and the fourth semiconductor layer,
the control electrode facing a portion of the second semiconductor layer, a portion of the third semiconductor layer and the other portion of the first semiconductor layer, the portion of the second semiconductor layer and the portion of the third semiconductor layer being positioned between the fourth semiconductor layer and the other part of the first semiconductor layer.

2. The device according to claim 1, wherein the fourth semiconductor layer is not provided between the first electrode and the first end portion of the third semiconductor layer.

3. The device according to claim 1, wherein the first semiconductor layer and the second semiconductor layer extend in a second direction and a third direction, the second direction being directed along the front surface of the semiconductor body and crossing the first direction, the third direction crossing the front surface of the semiconductor body.

4. The device according to claim 3, wherein the third semiconductor layer, the fourth semiconductor layer and the control electrode extend in the second direction.

5. The device according to claim 3, wherein
the semiconductor body further includes a fifth semiconductor layer of the second conductivity type and a sixth semiconductor layer of the first conductivity type, the fifth semiconductor layer contacting the other portion of the first semiconductor layer and the second semiconductor layer, the sixth semiconductor layer being selectively provided in the fifth semiconductor layer; and
the first electrode is electrically connected to the fifth semiconductor layer and the sixth semiconductor layer,
the semiconductor body includes a first region and a second region alternately arranged in the second direction, the first region including the third semiconductor layer and the fourth semiconductor layer, the second region includes the fifth semiconductor layer and the sixth semiconductor layer, the front surface of the semiconductor body including a surface of the fifth semiconductor layer and a surface of the sixth semiconductor layer, the fifth semiconductor layer including a third end portion and a fourth end portion, the third end portion being positioned in the other part of the first semiconductor layer, the fourth end portion being positioned in the second semiconductor layer, the sixth semiconductor layer being provided in the fourth end portion of the fifth semiconductor layer.

6. The device according to claim 1, wherein
the control electrode is disposed in a plurality in the first direction, and
the first electrode is electrically connected to the third semiconductor layer and the fourth semiconductor layer between the control electrodes adjacent in the first direction.

7. The device according to claim 1, wherein the third semiconductor layer contains a second conductivity type impurity having a concentration higher than a concentration of a second conductivity type impurity in the second semiconductor layer.

8. The device according to claim 1, wherein the fourth semiconductor layer contains a first conductivity type impurity having a concentration higher than a concentration of a first conductivity type impurity in the first semiconductor layer.

9. The device according to claim 1, wherein
the semiconductor body further includes a seventh semiconductor layer of the first conductivity type positioned between the first semiconductor layer and the second electrode, and
the second electrode is electrically connected to the seventh semiconductor layer.

10. The device according to claim 9, wherein the seventh semiconductor layer contains a first conductivity type impurity having a concentration higher than a concentration of a first conductivity type impurity in the first semiconductor layer.

11. The device according to claim 1, wherein
the first semiconductor layer includes a first amount of first conductivity type impurities in a first portion positioned between a level of an end of the second semiconductor layer and a level of a boundary between the third semiconductor layer and the second semiconductor layer,
the second semiconductor layer includes a second amount of second conductivity type impurities in a second portion being adjacent to the first portion of the first semiconductor layer, the second portion being positioned between an end of the second semiconductor layer on the second electrode side and the third semiconductor layer; and
the first amount of first conductivity type impurities balances the second amount of second conductivity type impurities.

12. A semiconductor device comprising:
a semiconductor body including a first semiconductor layer of a first conductivity type;
a first electrode provided on a front surface of the semiconductor body;
a second electrode provided on a back surface of the semiconductor body; and
a control electrode positioned between the semiconductor body and the first electrode, the control electrode being provided via an insulating film in the semiconductor body, the semiconductor body further including a second semiconductor layer of a second conductivity type, a third semiconductor layer of the first conductivity type, and a fourth semiconductor layer of the second conductivity type, the second semiconductor layer being provided between the first semiconductor layer and the first electrode, the third semiconductor layer being selectively provided between the second semiconductor layer and the first electrode, the fourth semiconductor layer being selectively provided between the first semiconductor layer and the control electrode, the fourth semiconductor layer being linked to the second semiconductor layer, the control electrode having a first surface and a second surface, the first surface crossing a first direction directed along the front surface of the semiconductor body, the second surface being opposed to the first surface in the first direction, the fourth semiconductor layer extending along the insulating film on the second surface side, the fourth semiconductor layer contacting the insulating film on the second surface side, the fourth semiconductor layer being connected to the second semiconductor layer on the insulating film, the first surface of the control electrode facing the first semiconductor layer, the second semiconductor layer and the third semiconductor layer via the insulating film, the second surface of the control electrode facing the second semiconductor layer and the fourth semiconductor layer via the insulating film.

13. The device according to claim 12, wherein
the semiconductor body further includes a fifth semiconductor layer of the second conductivity type selectively provided between the second semiconductor layer and the first electrode, and
the fifth semiconductor layer contains a second conductivity type impurity having a concentration higher than a concentration of a second conductivity type impurity in the second semiconductor layer, and is electrically connected to the first electrode.

14. The device according to claim 13, wherein
the control electrode is provided in a plurality,
the third semiconductor layer is positioned between the control electrode and the fifth semiconductor layer on the first surface side of the control electrode, and
the third semiconductor layer is not provided between other control electrode and the fifth semiconductor layer on the second surface side of the other control electrode.

15. The device according to claim 13, wherein
the semiconductor body further includes a plurality of sixth semiconductor layers of the second conductivity type provided in the first semiconductor layer and arranged in the first direction, and
the second semiconductor layer is positioned between the first electrode and the sixth semiconductor layers, and contacts the sixth semiconductor layers.

* * * * *